United States Patent
Yug (10) Patent No.: US 10,665,784 B2
(45) Date of Patent: May 26, 2020

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventor: Geun Woo Yug, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/416,880

(22) Filed: May 20, 2019

(65) Prior Publication Data

US 2019/0273208 A1 Sep. 5, 2019

Related U.S. Application Data

(62) Division of application No. 15/662,729, filed on Jul. 28, 2017, now Pat. No. 10,340,454.

(30) Foreign Application Priority Data

Oct. 7, 2016 (KR) .................. 10-2016-0130012

(51) Int. Cl.

| G11C 11/34 | (2006.01) |
|---|---|
| H01L 51/00 | (2006.01) |
| H01L 51/52 | (2006.01) |
| H01L 27/32 | (2006.01) |
| H01L 27/12 | (2006.01) |
| H01L 51/56 | (2006.01) |
| H01L 27/01 | (2006.01) |

(52) U.S. Cl.
CPC ...... *H01L 51/0009* (2013.01); *H01L 27/1214* (2013.01); *H01L 27/1218* (2013.01); *H01L 27/3244* (2013.01); *H01L 51/5237* (2013.01); *H01L 51/5253* (2013.01); *H01L 27/013* (2013.01); *H01L 27/32* (2013.01); *H01L 27/3276* (2013.01); *H01L 51/56* (2013.01); *H01L 2251/558* (2013.01); *H01L 2251/566* (2013.01)

(58) Field of Classification Search
CPC ............. H01L 51/0009; H01L 27/1214; H01L 51/5237; H01L 51/5253; H01L 27/013; H01L 27/32; H01L 27/3276; H01L 51/56
USPC ................................................ 365/230.05, 51
See application file for complete search history.

(56) References Cited

U.S. PATENT DOCUMENTS

| 5,530,266 A | 6/1996 | Yonehara et al. |
|---|---|---|
| 5,644,373 A | 7/1997 | Furushima et al. |
| 6,292,248 B1 | 9/2001 | Lee et al. |
| 6,562,551 B1 | 5/2003 | Porter et al. |
| 6,573,957 B1 | 6/2003 | Suzuki |

(Continued)

FOREIGN PATENT DOCUMENTS

| JP | 2013229427 A | 11/2013 |
|---|---|---|
| KR | 1020140015895 A | 2/2014 |

(Continued)

*Primary Examiner* — Viet Q Nguyen
(74) *Attorney, Agent, or Firm* — Cantor Colburn LLP (57) ABSTRACT

A display device includes a display panel and a first protective substrate positioned under the display panel and including a first sub-region and a second sub-region positioned at a side of the first sub-region. A thickness of the first protective substrate in the first sub-region is greater than a thickness of the first protective substrate in the second sub-region.

9 Claims, 6 Drawing Sheets (56) References Cited

U.S. PATENT DOCUMENTS

| | | |
|---|---|---|
| 9,022,633 B2 | 5/2015 | Ito |
| 9,235,997 B2 | 1/2016 | Kawanami |
| 9,276,212 B2 | 3/2016 | Park et al. |
| 9,299,613 B2 | 3/2016 | Jeong et al. |
| 9,704,897 B1 | 7/2017 | Fan et al. |
| 9,851,595 B2 | 12/2017 | Park et al. |
| 9,939,689 B2 | 4/2018 | Ma et al. |
| 10,114,498 B2 | 10/2018 | Ahn |
| 10,340,454 B2 * | 7/2019 | Yug .................. H01L 27/1214 |
| 2004/0012734 A1 | 1/2004 | Yamanaka et al. |
| 2008/0036746 A1 | 2/2008 | Klinghult |
| 2008/0252839 A1 | 10/2008 | Nakadaira |
| 2010/0245751 A1 * | 9/2010 | Muneyoshi ....... G02F 1/133305 |
| | | 349/149 |
| 2010/0316870 A1 | 12/2010 | Okabe et al. |
| 2011/0108314 A1 | 5/2011 | Pan et al. |
| 2011/0157510 A1 | 6/2011 | Hsu et al. |
| 2013/0273292 A1 | 10/2013 | Kim et al. |
| 2013/0302539 A1 | 11/2013 | Fujii et al. |
| 2014/0043244 A1 | 2/2014 | Van Lieshout et al. |
| 2014/0056181 A1 * | 2/2014 | Croak ............... H04M 3/42263 |
| | | 370/259 |
| 2015/0044931 A1 | 2/2015 | Mo |
| 2015/0129122 A1 | 5/2015 | Kim |
| 2016/0313762 A1 | 10/2016 | Kim et al. |
| 2016/0343984 A1 | 11/2016 | Zeng et al. |
| 2017/0359899 A1 | 12/2017 | Heo et al. |
| 2018/0138431 A1 | 5/2018 | Nishimura |
| 2018/0150170 A1 | 5/2018 | Oh et al. |
| 2018/0313991 A1 * | 11/2018 | Yug ..................... G02B 5/3025 |
| 2019/0067630 A1 * | 2/2019 | Hwang ............... H01L 51/5246 |

FOREIGN PATENT DOCUMENTS

| | | |
|---|---|---|
| KR | 1020140061898 A | 5/2014 |
| KR | 1020150045759 A | 4/2015 |
| KR | 1020170140475 A | 12/2017 |

* cited by examiner

DISPLAY DEVICE AND METHOD OF MANUFACTURING THE SAME

This application is a divisional of U.S. patent application Ser. No. 15/662,729, filed on Jul. 28, 2017, which claims priority to Korean Patent Application No. 10-2016-0130012, filed on Oct. 7, 2016, and all the benefits accruing therefrom under 35 U.S.C. § 119, the content of which in its entirety is herein incorporated by reference.

BACKGROUND

1. Field

Exemplary embodiments of the invention relate to a display device and a method of manufacturing the same.

2. Description of the Related Art

Due to interests in information display and demands on portable information media increasing, research on and commercialization of display devices are increasingly being performed.

Currently known display devices include a liquid crystal display ("LCD"), a plasma display panel ("PDP"), an organic light emitting display ("OLED"), a field effect display ("FED"), and an electrophoretic display ("ED").

SUMMARY

An exemplary embodiment of the invention relates to a display device with a relatively low defect rate.

An exemplary embodiment of the invention relates to a method of manufacturing a display device capable of reducing a defect rate and a manufacturing time by using a laser beam with low output power in a cutting process of a substrate to reduce short between wiring lines and then by using a laser beam with a high intensity in a cutting process of a remaining substrate.

An exemplary embodiment of the invention relates to a method of manufacturing a display device capable of improving manufacturing efficiency.

A display device according to an exemplary embodiment of the invention includes a display panel and a first protective substrate positioned under the display panel and including a first sub-region and a second sub-region positioned at a first side of the first sub-region. A thickness of the first protective substrate in the first sub-region is greater than a thickness of the first protective substrate in the second sub-region.

In an exemplary embodiment, the first protective substrate further includes a first cut surface positioned at the first side of the first sub-region and a second cut surface positioned at a side of the second sub-region, which is opposite to the first side of the first sub-region, and which is substantially parallel with the first cut surface.

In an exemplary embodiment, a slope of the first cut surface is different from a slope of the second cut surface.

In an exemplary embodiment, a slope of the first cut surface is smaller than a slope of the second cut surface.

In an exemplary embodiment, the slope of the first cut surface and the slope of the second cut surface are smaller than 90 degrees with respect to a bottom surface of the first protective substrate.

In an exemplary embodiment, a length of the first protective substrate in a direction along which the first and second sub-regions are arranged is longer than a length of the display panel in the direction.

In an exemplary embodiment, a difference between the thickness of the first protective substrate in the first sub-region and the thickness of the first protective substrate in the second sub-region is smaller than a thickness of the display panel.

In an exemplary embodiment, the display device further includes a first adhesive layer positioned between the first protective substrate and the display panel.

In an exemplary embodiment, a difference between the thickness of the first protective substrate in the first sub-region and the thickness of the first protective substrate in the second sub-region is smaller than the thickness of the first protective substrate in the second sub-region.

A method of manufacturing a display device according to an exemplary embodiment of the invention includes providing a first substrate and a second substrate disposed on the first substrate and on which a plurality of pixels and wiring lines is disposed, cutting the second substrate and a part of the first substrate by a first laser beam irradiating process so that a first sub-region is formed in the first substrate, and cutting off the remaining first substrate by a second laser beam irradiating process so that a second sub-region is formed in the first substrate. A laser beam output with a first intensity is irradiated in the first laser beam irradiating process and a laser beam output with a second intensity greater than the first intensity is irradiated in the second laser beam irradiating process, and a thickness of the first protective substrate in the first sub-region is greater than a thickness of the first protective substrate in the second sub-region.

In an exemplary embodiment, the first laser beam irradiating process and the second laser beam irradiating process are performed by a laser beam with the same type.

In an exemplary embodiment, a first cut surface is defined in regions where the second substrate and the part of the first substrate are cut by the first laser beam irradiating process. A second cut surface is defined in a region where the remaining first substrate is cut by the second laser beam irradiating process. The first cut surface and the second cut surface are inclined with respect to a bottom surface of the first substrate.

In an exemplary embodiment, a slope of the first cut surface is smaller than a slope of the second cut surface with respect to a bottom surface of the first substrate.

The first laser beam irradiating process includes irradiating a laser beam onto a plurality of points on a top surface of the second substrate.

In an exemplary embodiment, the plurality of points is positioned at a side of a region in which the wiring lines are disposed.

In an exemplary embodiment, a first point among the plurality of points is positioned on one end of each of the wiring lines.

In an exemplary embodiment, the second laser beam irradiating process is performed by irradiating a laser beam onto one point.

In an exemplary embodiment, the one point used for the second laser beam irradiating process is positioned on a first substrate exposed after the first laser beam irradiating process.

According to the invention, it is possible to provide a display device with a low defect rate.

In addition, according to the invention, it is possible to reduce a defect rate and a manufacturing time by using a laser beam with low output power in a cutting process of a substrate to reduce short between wiring lines and then by using a laser beam with a high intensity in a cutting process of a remaining substrate.

In addition, according to the invention, it is possible to improve manufacturing efficiency.

BRIEF DESCRIPTION OF THE DRAWINGS

Exemplary embodiments will now be described more fully hereinafter with reference to the accompanying drawings; however, they may be embodied in different forms and should not be construed as limited to the exemplary embodiments set forth herein. Rather, these exemplary embodiments are provided so that this disclosure will be thorough and complete, and will full convey the scope of the exemplary embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific items of exemplary embodiments of the invention are included in the detailed description and the accompanying drawings.

Advantages and features of the present invention, and implementation methods thereof will be clarified through following exemplary embodiments described with reference to the accompanying drawings. The present invention may, however, be embodied in different forms and should not be construed as limited to the exemplary embodiments set forth herein. Throughout this specification and the claims that follow, when it is described that an element is "connected" to another element, the element may be "directly connected" to the other element or "electrically connected" to the other element through a third element. In the accompanying drawings, a portion irrelevant to description of the present invention will be omitted for clarity. Like reference numerals refer to like elements throughout.

On the other hand, for convenience, a direction in which an image is displayed is referred to as "on" or "a front surface direction" and an opposite direction is referred to as "under" or "a rear surface direction".

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a display device according to an exemplary embodiment of the invention and a method of manufacturing the same will be described with reference to the drawings related to the exemplary embodiments of the present invention.

Figure 1:
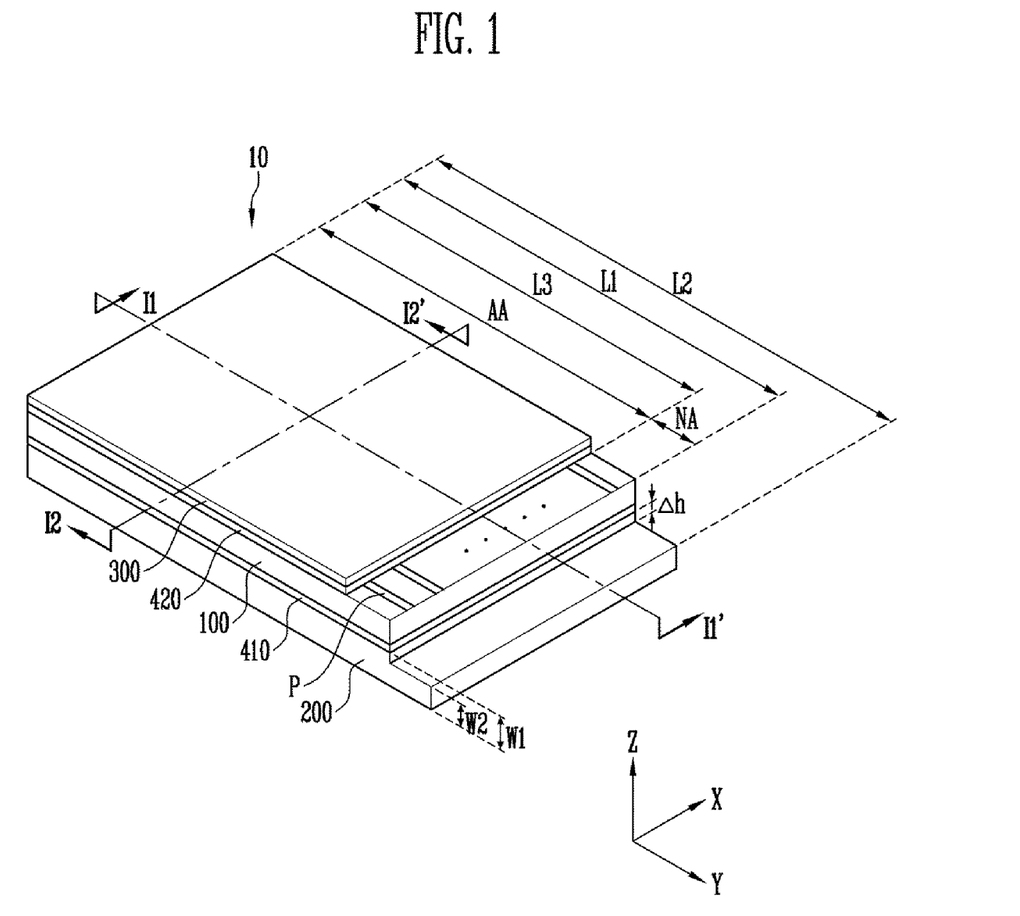
FIG. 1 is a perspective view illustrating an exemplary embodiment of a display device.
Figure 2:
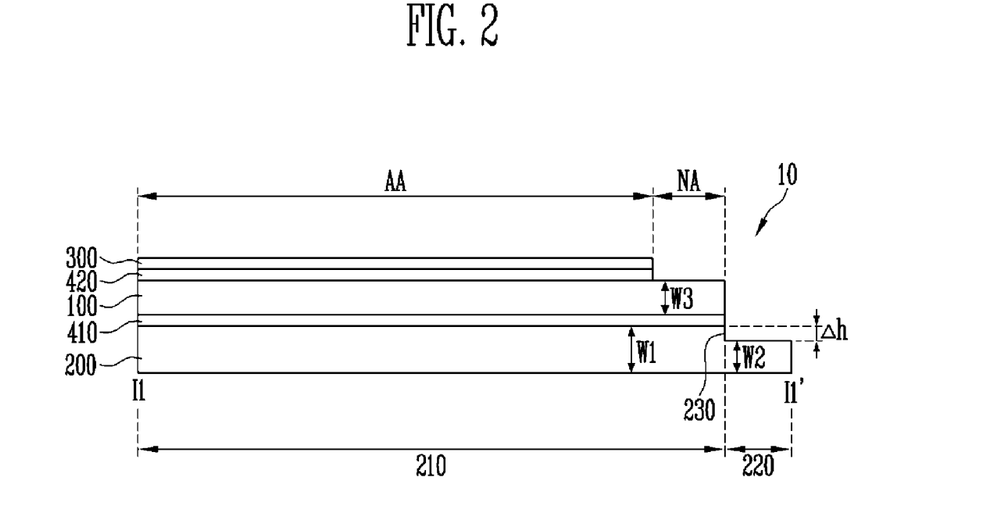
FIG. 2 is a cross-sectional view taken along line I1-I1' of FIG. 1.

FIG. 1 is a perspective view illustrating an exemplary embodiment of a display device 10. FIG. 2 is a cross-sectional view taken along line I1-I1' of FIG. 1.

Referring to FIGS. 1 and 2, the display device 10 according to the exemplary embodiment of the invention may include a display panel 100, a first protective substrate 200, and a second protective substrate 300.

The display panel 100 may display an image and may include a display region AA and a non-display region NA.

In the display region AA, a plurality of pixels for displaying the image may be arranged. Therefore, the display region AA is referred to as a pixel region.

The non-display region NA is positioned at a side of the display region AA. In the non-display region NA, wiring lines P for driving the plurality of pixels may be arranged.

In an exemplary embodiment, the display panel 100 may be one of a liquid crystal display ("LCD"), an electrophoretic display ("ED"), an organic light emitting display ("OLED"), an inorganic electro-luminescent display ("ELD"), a field emission display, ("FED"), a surface-conduction electron-emitter display ("SED"), a plasma display panel ("PDP"), and a cathode ray tube ("CRT"), for example.

The first protective substrate 200 is positioned under the display panel 100.

The first protective substrate 200 may have a size different from that of the display panel 100. In an exemplary embodiment, for example, a length L2 of the first protective substrate 200 may be larger than a length L1 of the display panel 100. The length L2 is a distance between two sides of the first protective substrate 200 in a direction Y. The length L1 is a distance between both sides of the display panel 100 facing each other in a direction Y.

Referring to FIG. 2, the first protective substrate 200 includes a first sub-region 210 and a second sub-region 220.

The first sub-region 210 may overlap the display panel 100.

The second sub-region 220 is positioned at a side of the first sib-region 210 and may not overlap the display panel 100. The second sub-region 220 may have an area smaller than that of the first sub-region 210.

In an exemplary embodiment, a thickness W1 of the first protective substrate 200 in the first sub-region 210 may be different from a thickness W2 of the first protective substrate 200 in the second sub-region 220. That is, a step difference 230 may exist between the first sub-region 210 and the second sub-region 220. The thickness W1 is a thickness of the first protective substrate 200 in the first sub-region 210 in a thickness direction Z. The thickness W2 is a thickness of the first protective substrate 200 in the second sub-region 210 in the thickness direction Z.

In this case, the thickness W1 of the first protective substrate 200 in the first sub-region 210 may be greater than the thickness W2 of the first protective substrate 200 in the second sub-region 220.

A height Δh of the step difference 230 may be smaller than a thickness W3 of the display panel 100. In an exemplary embodiment, the height Δh of the step difference 230 may be smaller than the thickness W2 of the first protective substrate 200 in the second sub-region 220. The thickness W3 is a thickness of the display panel 100 in the thickness direction Z.

In an exemplary embodiment, the second sub-region 220 may have an area smaller than that of the non-display region NA of the display panel 100. Specifically, a length difference between the length L2 of the first protective substrate 200 and the length L1 of the display panel 100 of the second sub-region 220 may be smaller than a length difference between the length L1 of the display panel 100 and a length L3 of a second protective substrate 300 (it will be defined later) of the non-display region NA.

The display panel 100 and the first protective substrate 200 may be attached to each other through a first adhesive layer 410. The first adhesive layer 410 may include a transparent adhesive material with relatively high transmittance. In an exemplary embodiment, a silicon adhesive, an acryl adhesive, a pressure sensitive adhesive ("PSA"), an optically clear adhesive ("OCA"), or an optically clear resin ("OCR") may be an example of the transparent adhesive material.

The second protective substrate 300 may be positioned on the display panel 100.

The second protective substrate 300 may have an area different from that of the display panel 100. In an exemplary embodiment, for example, the length L3 of the second protective substrate 300 may be smaller than the length L1 of the display panel 100.

The second protective substrate 300 may be positioned on the display region AA of the display panel 100.

In an exemplary embodiment that the length L3 of the second protective substrate 300 is smaller than the length L1 of the display panel 100, parts of the wiring lines P disposed in the non-display region NA may be exposed to the outside of the second protective substrate 300.

The display panel 100 and the second protective substrate 300 may be attached to each other through a second adhesive layer 420. In an exemplary embodiment, the second adhesive layer 420 may include a transparent adhesive material with relatively high transmittance such as a silicon adhesive, an acryl adhesive, a PSA, an OCA, and an OCR, for example. In another exemplary embodiment, the second protective substrate 300 and the second adhesive layer 420 may be omitted.

Although not shown in FIG. 1, a flexible printed circuit board ("FPCB") for transmitting a data signal and a control signal applied from the outside to the display panel 100 may be mounted in the non-display region.

A display driver for driving the display panel 100 may be mounted in the FPCB. In addition, the FPCB may be electrically connected to the wiring lines P.

Figure 3:
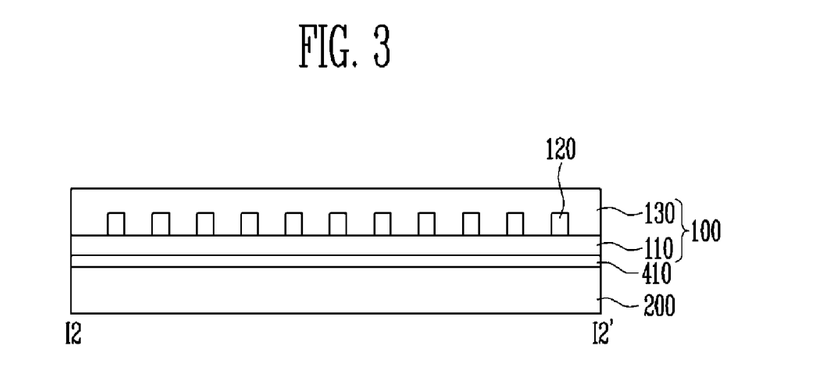
FIG. 3 is a cross-sectional view illustrating an exemplary embodiment of a display panel taken along line I2-I2' of FIG. 1.

FIG. 3 is a cross-sectional view illustrating an exemplary embodiment of a display panel taken along line I2-I2' of FIG. 1.

Referring to FIG. 3, the display panel 100 according to the exemplary embodiment of the invention may include a substrate 110, a plurality of pixels 120, and an encapsulation layer 130.

The plurality of pixels 120 may be positioned on the substrate 110. In addition, the encapsulation layer 130 may be positioned on the pixels 120 and the substrate 110.

In an exemplary embodiment, for example, the substrate 110 may include an insulating material such as glass and resin. In an exemplary embodiment, the substrate 110 may have a single layer structure or a multilayer structure and may include a flexible material such that the substrate 110 may be bent or folded, for example.

In particular, the substrate 110 may include polyimide so as to be flexibly bent or folded, for example.

In an exemplary embodiment, the substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polycarbonate, triacetate cellulose, and cellulose acetate propionate, for example.

The material the substrate 110 includes is not limited thereto. The material the substrate 110 includes may vary.

The pixels 120 may emit light under a control of the display driver (not shown) and may be protected by the encapsulation layer 130.

In an exemplary embodiment, for example, the encapsulation layer 130 may prevent moisture and oxygen from permeating into the pixels 120.

In an exemplary embodiment, the encapsulation layer 130 may include at least one of glass, an organic material, and an inorganic material and may have a single layer structure or a multilayer structure, for example.

In an exemplary embodiment, for example, the encapsulation layer 130 may have a multilayer structure including at least one organic layer and at least one inorganic layer, for example.

In an exemplary embodiment, the organic layer may include a fluorine based carbon compound such as polyacryl, polyimide, and Teflon, or an organic insulating material such as polyepoxy, and benzocyclobutene. In an exemplary embodiment, the inorganic layer may include an inorganic insulating material such as a metal oxide including at least one of polysiloxane, a silicon nitride, a silicon oxide, and an aluminum oxide.

Figure 4:
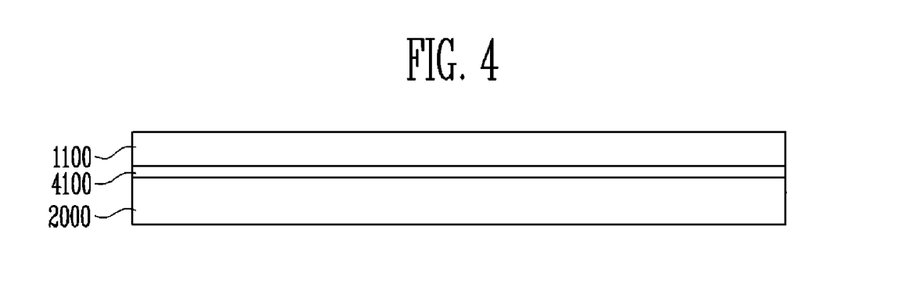
FIGS. 4 through 6 are views illustrating an exemplary embodiment of parts of a method of manufacturing a display device.
Figure 5:
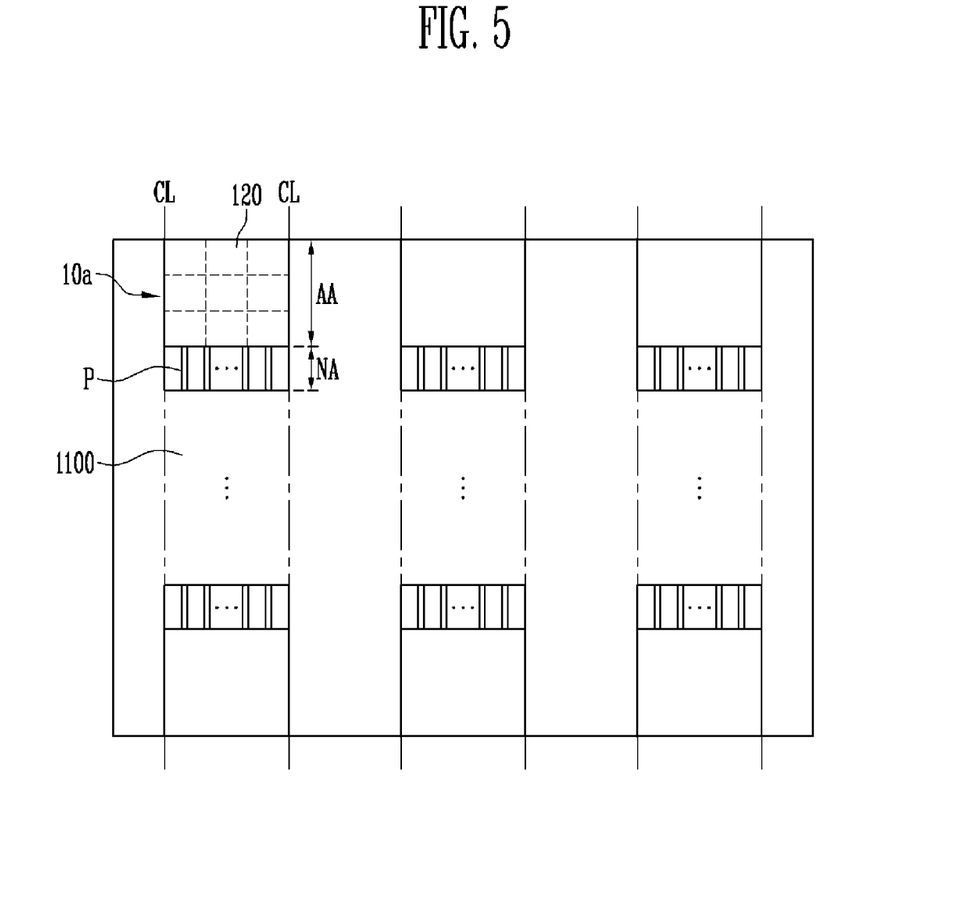
Figure 6:
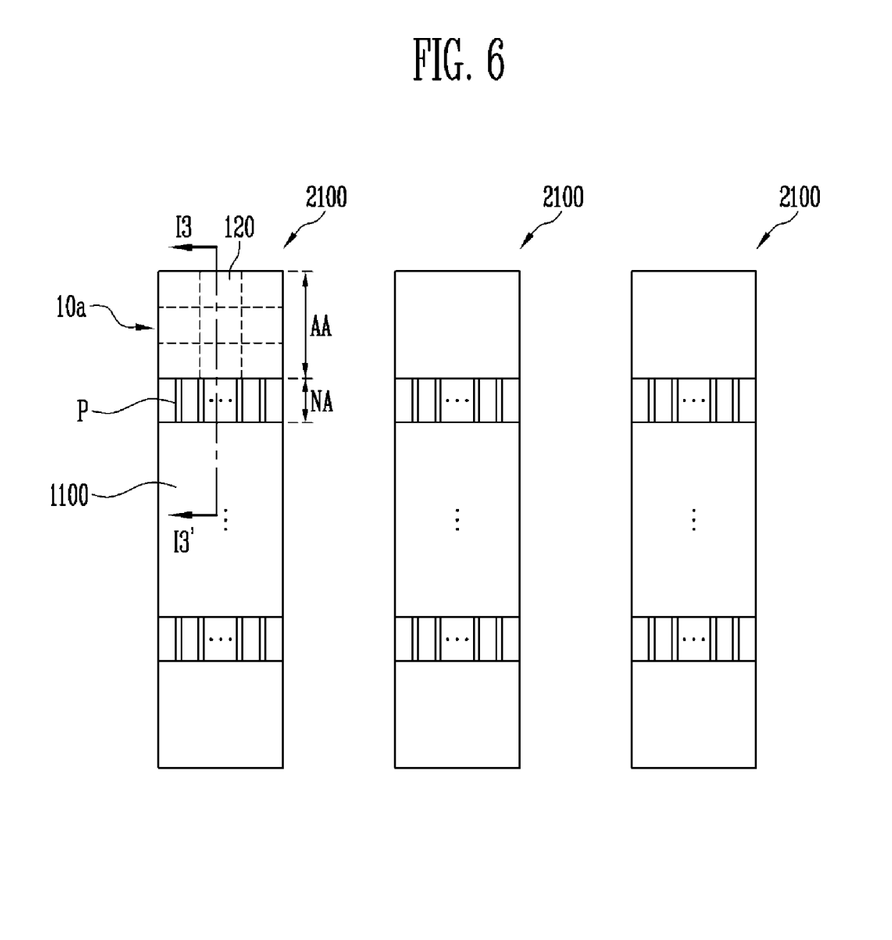

FIGS. 4 through 6 are views illustrating an exemplary embodiment of parts of a method of manufacturing a display device.

A first substrate 2000 and a second substrate 1100 that are sequentially disposed may be provided.

Referring to FIG. 4, the second substrate 1100 may be disposed on the first substrate 2000. In particular, the second substrate 1100 may be attached to the first substrate 2000 through an adhesive layer 4100, for example.

Each of the first substrate 2000 and the second substrate 1100 may have a large area enough such that n×m (n and m are natural numbers) display panel regions 10a in numbers may be disposed on the second substrate 1100. The plurality of pixels 120 and wiring lines P required in one display device are to be formed in one display panel region 10a.

After a cutting process to be described later, the first substrate 2000 may function as the first protective substrate 200 illustrated in FIGS. 1 to 3.

In an exemplary embodiment, the first substrate 2000 may include a flexible material so as to be bent or folded, may have a single layer structure or a multilayer structure, and may include a plastic material such as polyethylene phthalate, for example.

In an exemplary embodiment, the first substrate 2000 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate, for example.

After the cutting process, the second substrate 1100 may function as the substrate 110 of the display panel 100 illustrated in FIGS. 1 to 3.

In an exemplary embodiment, the second substrate 1100 may include a flexible material so as to be bent or folded and may have a single layer structure or a multilayer structure, for example. In addition, the second substrate 1100 may include a material different from that of the first substrate 2000. In an exemplary embodiment, the second substrate 1100 may include polyimide so as to be flexibly bent or folded, for example.

The adhesive layer 4100 may correspond to the first adhesive layer 410 illustrated in FIGS. 1 to 3. Therefore, in an exemplary embodiment, the adhesive layer 4100 may include a transparent adhesive material with relatively high transmittance such as the silicon adhesive, the acryl adhesive, the PSA, the OCA, and the OCR.

Referring to FIG. 5, the pixels 120 and the wiring lines P may be disposed in each of the plurality of display panel regions 10a provided on the second substrate 1100.

The display region AA and the non-display region NA may be included in each of the display panel regions 10a.

The plurality of pixels 120 may be included in the display region AA. Each of the pixels 120 may include switching elements, e.g., a thin film transistors ("TFT"), turned on/off in accordance with a control signal applied from the outside and a light emitting element that emits light in accordance with control of the switching elements.

For this purpose, a thin film layer including a plurality of TFTs, data lines, gate lines, and light emitting elements and an encapsulation layer for protecting the thin film layer may be provided in the display region AA.

In each of the non-display regions NA, the wiring lines P that receive the control signal applied from the outside to drive the pixels may be provided.

In FIG. 5, it is illustrated that 3×m display panel regions 10a are provided on the second substrate 1100. However, the invention is not limited thereto. The number of display panel regions 10a provided on the second substrate 1100 may vary.

After the pixels 120 and the wiring lines P in each of the display panel regions 10a are provided, a second protective substrate may be provided. In FIG. 5, the second protective substrate is not illustrated. However, the second protective substrate may have the same configuration as the second protective substrate 300 illustrated in FIGS. 1 and 2.

The second protective substrate may be attached onto the display region AA through an adhesive layer. In this case, the second protective substrate may be provided only on the display region AA such that the wiring lines P formed in the non-display region NA are exposed from the second protective substrate and may be connected to a separate circuit substrate.

In an exemplary embodiment, the first substrate 2000 and the second substrate 1100 may be cut off after the second protective substrate 300 is attached as described above. However, the invention is not limited thereto. The second protective substrate 300 may be attached after the first substrate 2000 and the second substrate 1100 are cut off.

Then, after the first substrate 2000 and the second substrate 1100 attached onto the first substrate 2000 and on which the plurality of pixels 120 and wiring lines P are disposed are provided, a laser may be arranged on the second substrate 1100.

The laser may irradiate a laser beam while moving along cut lines CL. Therefore, the first substrate 2000, the adhesive layer 4100, and the second substrate 1100 may be cut off along the cut lines CL.

In an exemplary embodiment, the laser may be a solid laser and may particularly irradiate a laser beam having a wavelength of about 515 nanometers (nm), for example.

In an exemplary embodiment, the cut lines CL may coincide with both sides of the display panel region 10a.

When the first substrate 2000 is cut off along the cut lines CL as illustrated in FIG. 5, a plurality of panels 2100 are provided as illustrated in FIG. 6.

Since 1×m display panel regions 10a are included in each of the panels 2100, m display devices may be generated from each of the panels 2100.

Figure 7:
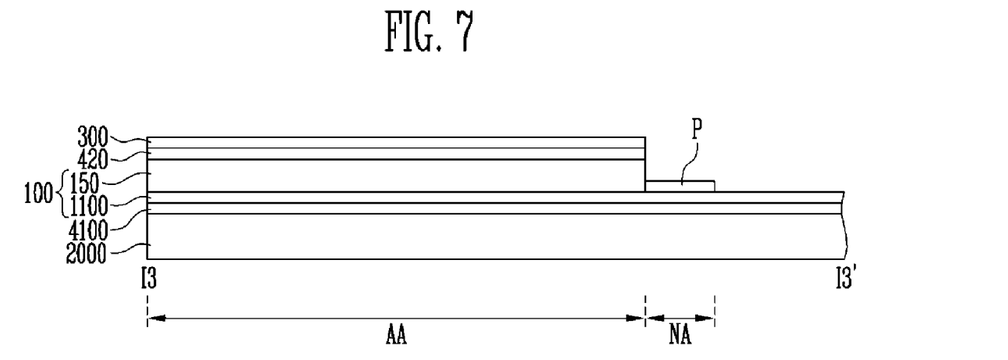
FIG. 7 is a cross-sectional view taken along line I3-I3' of FIG. 6.

FIG. 7 is a cross-sectional view taken along line I3-I3' of FIG. 6.

Referring to FIG. 7, the panel 2100 may include the adhesive layer 4100 and the second substrate 1100 sequentially disposed on the first substrate 2000.

A thin film layer including a plurality of TFTs, data lines, gate lines, and light emitting elements and a display unit 150 including an encapsulation layer for protecting the thin film layer may be provided in the display region AA. The wiring lines P may be provided in the non-display region NA.

In an exemplary embodiment, the display unit 150, the wiring lines P, and a part of the second substrate 1100 that overlaps the display region AA and the non-display region NA in total may be referred to as the display panel 100 illustrated in FIGS. 1 and 2.

The second protective substrate 300 may be attached onto the display unit 150 through the second adhesive layer 420.

Since a plurality of display panels 100 are provided on the panel 2100 illustrated in FIG. 7, the panel 2100 needs to be cut off and separated such that only one display panel 100 may be disposed on one first substrate 2000.

Hereinafter, a method of cutting off the first substrate 2000 and the second substrate 1100 in regions adjacent to the wiring lines P provided in the non-display region NA will be described in detail.

The method of cutting off the first substrate 2000 and the second substrate 1100 according to the exemplary embodiment of the invention may include a first laser beam irradiating process and a second laser beam irradiating process.

First, the entire second substrate 1100 and a part of the first substrate 2000 are cut by the first laser beam irradiating process and the remaining part of the first substrate 2000 is cut by the second laser beam irradiating process such that the first substrate 2000 and the second substrate 1100 may be cut off.

Figure 8:
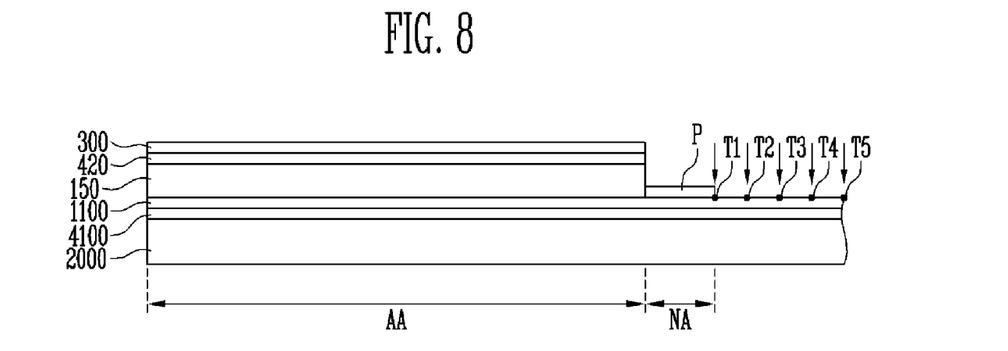
FIGS. 8 and 9 are views illustrating an exemplary embodiment of a first laser beam irradiating process.
Figure 9:
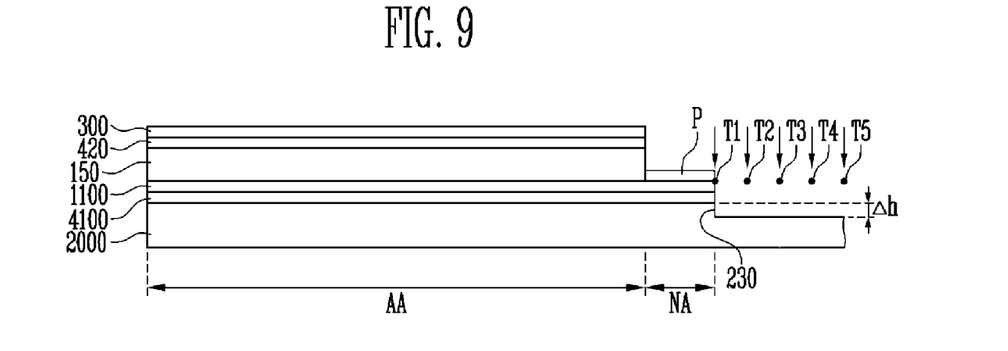

FIGS. 8 and 9 are views illustrating an exemplary embodiment of a first laser beam irradiating process. In particular, FIG. 8 is a view illustrating an exemplary embodiment of a state before the first laser beam irradiating process is performed and FIG. 9 is a view illustrating an exemplary embodiment of a state after the first laser beam irradiating process is performed.

Referring to FIG. 8, the first laser beam irradiating process may be performed on a plurality of points T1 through T5. That is, the laser beam may be irradiated onto the plurality of points T1 through T5.

In an exemplary embodiment, the laser used during the first laser beam irradiating process may be the solid laser and may particularly irradiate the laser beam having the wavelength of about 515 nm, for example.

The plurality of points T1 through T5 may include the first point T1, the second point T2, the third point T3, the fourth point T4, and the fifth point T5.

Since regions corresponding to the first through fifth points T1 through T5 are removed, the first through fifth points T1 through T5 may be selected as points outside the non-display region NA.

In an exemplary embodiment, the first point T1 may be disposed at a point adjacent to or corresponding to one end of each of the wiring lines P, and the second through fifth points T2 through T5 may be sequentially arranged to be remote from the wiring lines P.

In an exemplary embodiment, distances between adjacent points among the points T1 through T5 may be the same, and a distance between the points that are remotest from each other, e.g., the first point T1 and the fifth point T5, may be about 120 micrometers (μm), for example.

The laser may irradiate the laser beam while sequentially moving from the first point T1 to the fifth point T5. In an exemplary embodiment, after irradiating the laser beam onto the fifth point T5, the laser may irradiate the laser beam while sequentially moving to the first point T1 again. That is, the laser beam may be irradiated onto each of the points T1 through T5 several times.

Types and intensities of laser beams respectively irradiated onto the points T1 through T5 may be the same. In addition, amounts of the laser beams respectively irradiated onto the points T1 through T5 may be the same.

In an exemplary embodiment, the laser may move at the same speed, for example, at a speed of about 6 meters per second (m/s).

As illustrated in FIG. 9, the first laser beam irradiating process may be performed until the second substrate 1100 is completely cut and a part of the first substrate 2000 is cut in the regions corresponding to the first through fifth points T1 through T5.

In an exemplary embodiment, a thickness of the cut first substrate 2000 may be about 30 percentages (%) to about 40% of a thickness of the display panel 100 which is a sum of a thickness of the second substrate 1100 and a thickness of the display unit 150. In an exemplary embodiment, for example, when the thickness of the display panel 100 is about 35 μm, the thickness of the first substrate 2000 cut during the first laser beam irradiating process may be about 10 μm.

That is, the step difference 230 may exist in the first substrate 2000 and the height Δh of the step difference 230 may be about 30% to about 40% of the thickness of the display panel 100.

In the case that the second substrate 1100 according to the exemplary embodiment of the invention includes a plastic material including polyimide, when the laser beam is irradiated onto the second substrate 1100, the second substrate 1100 reacts to heat caused by the laser beam such that a conductive carbide ash may be generated.

That is, after the laser beam irradiating process, the conductive carbide ash may remain around a cut surface. In particular, when the conductive carbide ash remains around the cut surface on which the wiring lines P are positioned, the wiring lines P may be electrically shorted.

Therefore, in order to prevent the conductive carbide ash from being generated while the second substrate 1100 is cut off, output power of the laser beam may be reduced.

According to the exemplary embodiment of the invention, while the first laser beam irradiating process is performed, the output power of the laser beam may have a first intensity. The first intensity may be about 30% to about 40% of the maximum output power of the laser beam. In an exemplary embodiment, for example, when a laser beam, maximum output power of which is 30 watts, is used, the laser beam of about 10 watts may be output while the first laser beam irradiating process is performed.

According to an exemplary embodiment of the invention, it is possible to prevent the conductive carbide ash from being generated by reducing the output power of the laser beam and to reduce an influence of heat caused by the laser beam irradiated onto the second substrate 1100 by irradiating the laser beam onto several points T1 through T5, not just one point.

In FIGS. 8 and 9, it is illustrated that the number of points onto which the laser beam is irradiated is five. However, the invention is not limited thereto. The number of points onto which the laser beam is irradiated may vary.

After the first laser beam irradiating process is performed, the second laser beam irradiating process for cutting off the remaining part of the first substrate 2000 may be performed.

Figure 10:
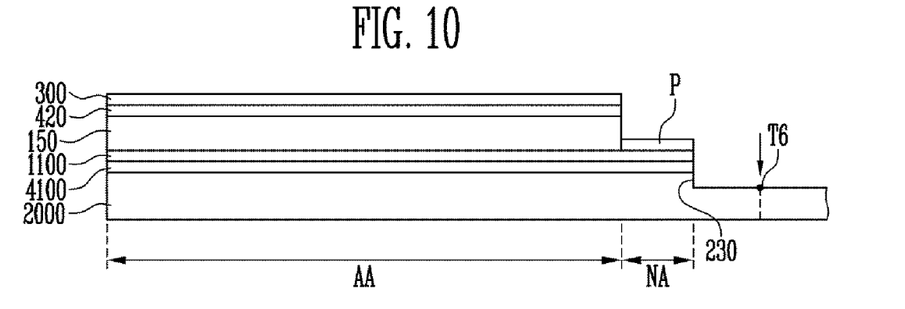
FIGS. 10 and 11 are views illustrating an exemplary embodiment of a second laser beam irradiating process.
Figure 11:
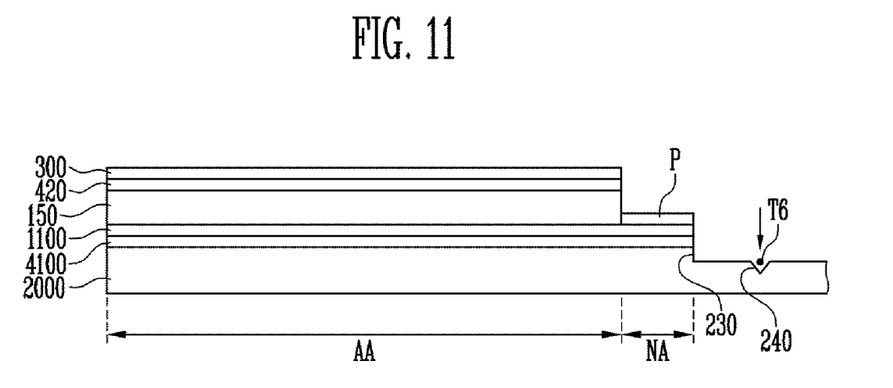

FIGS. 10 and 11 are views illustrating an exemplary embodiment of a second laser beam irradiating process.

Referring to FIGS. 10 and 11, the second laser beam irradiating process may be performed on a sixth point T6.

That is, a laser beam may be irradiated onto the sixth point T6 in the second laser beam irradiating process.

FIG. 10 is a view illustrating an exemplary embodiment of a state before a laser beam is irradiated, and FIG. 11 is a view illustrating an exemplary embodiment of a process of cutting of the first substrate 2000.

In the first laser beam irradiating process, since the laser beam is irradiated onto the plurality of points T1 through T5, a cut width is large. However, in the second laser beam irradiating process, since the laser beam is irradiated onto one point T6, a cut width may be small. The cut width means a width of the cut region by the laser beam irradiating process.

The point T6 used for the second laser beam irradiating process may be the same as or different from one of the points T1 through T5 used for the first laser beam irradiating process.

In an exemplary embodiment, the sixth point T6 may be positioned on a center of the cut region during the first laser beam irradiating process. In an exemplary embodiment, a distance from the step difference 230 of the first substrate 2000 to the sixth point T6 may be about 40 μm to about 50 μm, for example.

In an exemplary embodiment, the laser beam used for the second laser beam irradiating process may be the same as the laser beam used for the first laser beam irradiating process.

In another exemplary embodiment, the output power of the laser beam used for the second laser beam irradiating process may be different from the output power of the laser beam used for the first laser beam irradiating process. The output power of the laser beam used for the second laser beam irradiating process may have a second intensity. In an exemplary embodiment, the second intensity may be larger than the first intensity.

According to an exemplary embodiment of the invention, the first substrate 2000 may include a plastic material such as polyethylene phthalate.

That is, unlike the second substrate 1100, although heat caused by the laser beam is applied to the first substrate 2000, the conductive carbide ash may not be generated. Therefore, in the second laser beam irradiating process, the laser beam having the second intensity may be irradiated onto one point P6 such that the first substrate 2000 may be cut off within a short time.

In an exemplary embodiment, the second intensity may be about 80% to 100% of maximum output power of the laser beam. In an exemplary embodiment, for example, when a laser beam, maximum output power of which is about 30 watts, is used, the laser beam of about 25 watts may be output while the second laser beam irradiating process is performed.

In an exemplary embodiment, the second intensity may be set to be two to three times the first intensity, for example.

A shape of a cut surface 240 of the first substrate 2000 may vary in accordance with a magnitude of the second intensity.

In an exemplary embodiment, for example, as the second intensity increases, the cut surface 240 of the first substrate 2000 may be almost perpendicular to a plane defined by the axes X and Y and, as the second intensity is reduced, an angle between the cut surface 240 and the plane may be reduced.

Figure 12:
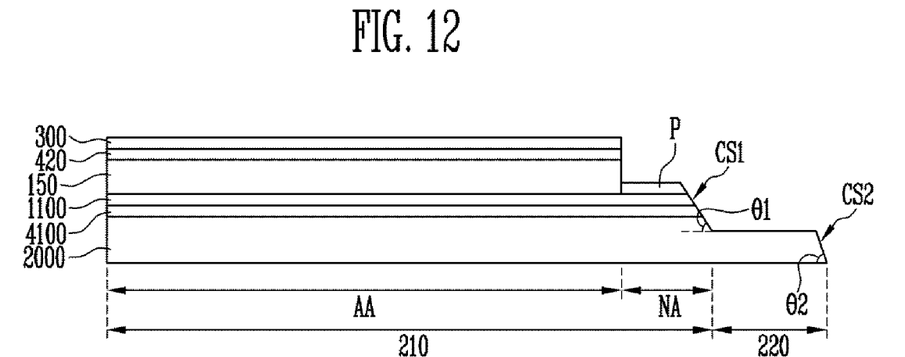
FIG. 12 is a view illustrating an exemplary embodiment of a state in which a first substrate is cut off after the second laser beam irradiating process.

FIG. 12 is a view illustrating an exemplary embodiment of a state that a first substrate is cut off after the second laser beam irradiating process.

Referring to FIG. 12, a first cut surface CS1 may be formed in parts of the wiring line P, the second substrate 1100, the adhesive layer 4100, and the first substrate 2000 by the first laser beam irradiating process.

In addition, a second cut surface CS2 may be formed in the remaining part of the first substrate 2000 by the second laser beam irradiating process.

In FIGS. 1, 2, and 9 through 11, for convenience, it is illustrated that the first cut surface CS1 and the second cut surface CS2 are perpendicular to a plane defined by the axes X and Y. However, in another exemplary embodiment, the first cut surface CS1 and the second cut surface CS2 may be inclined with a slope of less than 90 degrees with respect to a plane defined by the axes X and Z.

That is, the first cut surface CS1 may be inclined to have an angle of θ1 with respect to the plane and the second cut surface CS2 may be inclined to have an angle of θ2 with respect to the plane.

In an exemplary embodiment, the angle θ1 between the first cut surface CS1 and the plane may be different from the angle θ2 between the second cut surface CS2 and the plane.

A slope of a cut surface with respect to the plane formed by a laser beam irradiating process may vary in accordance with output power of the laser beam.

In an exemplary embodiment, since the output power, the first intensity, of the laser beam used for the first laser beam irradiating process is smaller than the output power, the second intensity, of the laser beam used for the second laser beam irradiating process, the angle θ1 formed between the first cut surface CS1 and the plane may be smaller than the angle θ2 formed between the second cut surface CS2 and the plane. This relation may be expressed as the following formula, θ1<θ2. That is, the slope of the second cut surface CS2 may be greater than the slope of the first cut surface CS1.

That is, the display device manufactured according to the exemplary embodiment of the invention may include the first cut surface CS1 positioned at a side of the first sub-region 210 and the second cut surface CS2 positioned at a side of the second sub-region 220, which is opposite to the side of the first sub-region 210 at which the first cut surface CS1 is positioned, and which is parallel with the first cut surface CS1. The slope of the first cut surface CS1 may be different from the slope of the second cut surface CS2.

In an exemplary embodiment, the slope of the first cut surface CS1 may be smaller than the slope of the second cut surface CS2, and the slope of the first cut surface CS1 and the slope of the second cut surface CS2 may be smaller than 90 degrees, for example.

According to the exemplary embodiment of the invention, it is possible to prevent the conductive carbide ash from being generated from the second substrate 110 by irradiating the laser beam with reduced output power. However, when the output power of the laser beam is reduced, manufacturing efficiency deteriorates since it takes long to cut off both the second substrate 1100 and the first substrate 2000.

According to an exemplary embodiment of the invention, it is possible to reduce manufacturing time of the display device as well as to prevent the conductive carbide ash from being generated by cutting off the second substrate 1100 that may generate the conductive carbide ash by the laser beam with low output power and by cutting off the remaining first substrate 2000 by the laser beam with a high intensity.

In an exemplary embodiment that a laser with the same type is used when the first and second laser beam irradiating processes are performed, it is possible to reduce a process time more, for example.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular exemplary embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display device, the method comprising:
   providing a first substrate and a second substrate disposed on the first substrate and in which a plurality of pixels and wiring lines is disposed;
   cutting the second substrate and a part of the first substrate by a first laser beam irradiating process so that a first sub-region is formed in the first substrate; and
   cutting off a remaining first substrate by a second laser beam irradiating process so that a second sub-region is formed in the first substrate,
   wherein a laser beam output with a first intensity is irradiated in the first laser beam irradiating process, and a laser beam output with a second intensity greater than the first intensity is irradiated in the second laser beam irradiating process, and
   wherein a thickness of the first substrate in the first sub-region is greater than a thickness of the first substrate in the second sub-region.

2. The method of claim 1, wherein the first laser beam irradiating process and the second laser beam irradiating process are performed by a laser beam with the same type.

3. The method of claim 1,
   wherein a first cut surface is defined in regions where the second substrate and the part of the first substrate are cut by the first laser beam irradiating process,
   wherein a second cut surface is defined in a region where the remaining first substrate is cut by the second laser beam irradiating process, and
   wherein the first cut surface and the second cut surface are inclined with respect to a bottom surface of the first substrate.

4. The method of claim 3, wherein a slope of the first cut surface is smaller than a slope of the second cut surface with respect to the bottom surface of the first substrate.

5. The method of claim 1, wherein the first laser beam irradiating process comprises irradiating a laser beam onto a plurality of points on a top surface of the second substrate.

6. The method of claim 5, wherein the plurality of points are positioned at a side of a region in which the wiring lines are disposed.

7. The method of claim 5, wherein a first point among the plurality of points is positioned on one end of each of the wiring lines.

8. The method of claim 1, wherein the second laser beam irradiating process is performed by irradiating a laser beam onto one point.

9. The method of claim 8, wherein the one point used for the second laser beam irradiating process is positioned on a first substrate exposed after the first laser beam irradiating process.

* * * * *